US009627996B1

(12) United States Patent
Orita

(10) Patent No.: US 9,627,996 B1
(45) Date of Patent: Apr. 18, 2017

(54) CONTROLLER OF VARIABLE STIFFNESS MECHANISM

(71) Applicant: HONDA MOTOR CO., LTD., Tokyo (JP)

(72) Inventor: Atsuo Orita, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/075,846

(22) Filed: Mar. 21, 2016

(51) Int. Cl.
*H01L 41/04* (2006.01)
*H02N 2/06* (2006.01)

(52) U.S. Cl.
CPC ........... *H02N 2/062* (2013.01); *H01L 41/042* (2013.01)

(58) Field of Classification Search
CPC ........ H02N 2/062; H01L 41/042; H01L 41/08
USPC ........ 318/116; 310/308, 311, 313, 334, 328, 310/323, 325; 248/550
See application file for complete search history.

(56) References Cited

U.S. PATENT DOCUMENTS

| 6,768,246 | B2 * | 7/2004 | Pelrine | F02G 1/043 310/317 |
| 6,891,317 | B2 * | 5/2005 | Pei | A61M 5/142 310/328 |
| 7,064,472 | B2 * | 6/2006 | Pelrine | A61M 5/142 310/324 |
| 7,233,097 | B2 * | 6/2007 | Rosenthal | A61M 5/142 310/328 |
| 7,320,457 | B2 * | 1/2008 | Heim | F04B 35/045 239/601 |
| 7,362,032 | B2 * | 4/2008 | Pelrine | A61M 5/142 310/309 |
| 7,394,182 | B2 * | 7/2008 | Pelrine | A61M 5/142 310/328 |
| 7,521,840 | B2 * | 4/2009 | Heim | F04B 43/0054 310/330 |
| 7,537,197 | B2 * | 5/2009 | Heim | F16K 99/0001 239/601 |
| 7,703,742 | B2 * | 4/2010 | Heim | F16K 99/0001 239/597 |
| 7,761,981 | B2 * | 7/2010 | Rosenthal | A61M 5/142 29/825 |
| 7,971,850 | B2 * | 7/2011 | Heim | F16K 99/0001 239/597 |

(Continued)

FOREIGN PATENT DOCUMENTS

JP 2003-174205 6/2003
JP 2003174205 A * 6/2003

*Primary Examiner* — Rita Leykin
(74) *Attorney, Agent, or Firm* — Rankin, Hill & Clark LLP

(57) ABSTRACT

A present invention provides a device capable of controlling a variable stiffness mechanism, which has a dielectric elastomer interposed between two members, so as to suppress an increase in the strain of the dielectric elastomer caused by the creep phenomenon. A power source control unit 21 corrects a reference supply voltage Vbase of an output voltage of a power source 10, which is determined on the basis of a desired degree of stiffness of a dielectric elastomer 1, by a feedback manipulated variable determined on the basis of a difference between a desired value of the capacitance of the elastomer 1 and an estimated value thereof, thereby setting a desired value for controlling the output voltage of the power source 10 in order to control the power source 10 according to the desired value for control.

5 Claims, 6 Drawing Sheets

(56) References Cited

U.S. PATENT DOCUMENTS

| | | | | |
|---|---|---|---|---|
| 8,042,264 B2* | 10/2011 | Rosenthal | ............ | A61M 5/142 |
| | | | | 29/25.03 |
| 8,093,783 B2* | 1/2012 | Rosenthal | ............ | A61M 5/142 |
| | | | | 310/328 |
| 9,170,288 B2* | 10/2015 | O'Brien | ................ | H01L 41/042 |
| 2009/0184606 A1* | 7/2009 | Rosenthal | ............ | A61M 5/142 |
| | | | | 310/367 |
| 2012/0299514 A1* | 11/2012 | Anderson | ............ | H01L 41/107 |
| | | | | 318/116 |
| 2013/0100575 A1* | 4/2013 | O'Brien | ................ | H02N 2/181 |
| | | | | 361/283.1 |
| 2014/0054438 A1* | 2/2014 | Yun | ...................... | G06F 1/1652 |
| | | | | 248/550 |
| 2014/0197936 A1* | 7/2014 | Biggs | ...................... | G08B 6/00 |
| | | | | 340/407.1 |
| 2015/0091413 A1* | 4/2015 | Lee | ........................ | H01L 27/20 |
| | | | | 310/328 |
| 2016/0260888 A1* | 9/2016 | Alexander | .......... | H01L 41/0475 |
| 2016/0351782 A1* | 12/2016 | Orita | .................. | H01L 41/0478 |
| 2016/0352254 A1* | 12/2016 | Orita | ..................... | H02N 1/002 |

* cited by examiner

CONTROLLER OF VARIABLE STIFFNESS MECHANISM

BACKGROUND OF THE INVENTION

Field of the Invention

The present invention relates to a controller of a variable stiffness mechanism having a dielectric elastomer, which elastically deforms according to a voltage applied thereto.

Description of the Related Art

A dielectric elastomer has the property that, when a voltage is applied thereto, the dielectric elastomer is compressed by Maxwell stresses in the direction of an electric field attributable to the applied voltage. Further, the stiffness or the like of the dielectric elastomer can be controlled to a required target state by variably manipulating the voltage applied to the dielectric elastomer (hereinafter may be referred to simply as "the elastomer"). For this reason, the elastomer has been used in a variety of technical fields in recent years.

For example, Japanese Patent Application Laid-Open No. 2003-174205 (hereinafter referred to as "Patent Document 1") proposes a device capable of changing the stiffness of a sheet-like elastomer installed between two members, which are mutually relatively displaceable, by manipulating a voltage applied to the elastomer.

The elastomer is generally composed of a polymer (polymeric material). In this case, if a state in which an external force acts on the elastomer continues, then the creep phenomenon causes the strain of the elastomer to increase and eventually break the elastomer.

Hence, a technique for suppressing an increase in the strain of the elastomer attributable to the creep phenomenon is desired for a device like the one described in Patent Document 1.

SUMMARY OF THE INVENTION

The present invention has been made in view of the background described above, and an object of the invention is to provide a device capable of controlling a variable stiffness mechanism, in which a dielectric elastomer is installed between two members, such that an increase in the strain of the dielectric elastomer caused by the creep phenomenon can be suppressed.

To this end, a controller of a variable stiffness mechanism in accordance with the present invention is a controller of a variable stiffness mechanism that has a dielectric elastomer, the dielectric elastomer being interposed between a first member and a second member, which is relatively displaceable with respect to the first member, such that an elastic force is generated according to a relative displacement between the first member and the second member, and the dielectric elastomer also being configured such that a degree of stiffness thereof can be changed according to an applied voltage, the controller including:

a power source which outputs a voltage applied to the dielectric elastomer such that the voltage can be variably controlled;

a power source control unit which controls an output of the power source; and a capacitance estimating unit which sequentially estimates a capacitance of the dielectric elastomer, wherein the power source control unit is configured to carry out processing for setting a desired reference value of the applied voltage to meet a requirement related to the degree of stiffness of the dielectric elastomer in response to the requirement, processing for setting a desired value of the capacitance of the dielectric elastomer from the desired reference value and an observation value of an amount of the relative displacement between the first member and the second member based on a pre-established correlation among the voltage applied to the dielectric elastomer, the amount of relative displacement, and the capacitance of the dielectric elastomer, and processing for setting a desired value for control of an output voltage of the power source by correcting the desired reference value by a feedback manipulated variable determined based on a difference between the desired value of the capacitance and an estimated value of the capacitance obtained by the capacitance estimating unit such that the difference is approximated to zero, thereby controlling the output of the power source according to the desired value for control (a first aspect of the invention).

In the present invention, the phrase "an observation value of an amount of the relative displacement between the first member and the second member" means an estimated value obtained by estimating from a detection value of the amount of the relative displacement acquired by an appropriate sensor or a detection value or values of one or more state amounts, which have a certain correlation with the amount of the relative displacement, on the basis of the correlation.

In the following description of the present invention, the dielectric elastomer may be referred to simply as the elastomer.

According to the first aspect of the invention, the desired value of the capacitance is set based on the correlation from the desired reference value and the observation value of the amount of the relative displacement between the first member and the second member. Hence, the desired value corresponds to the value of the capacitance of the elastomer specified by a pair of the desired reference value and the observation value of the amount of the relative displacement in a state wherein there is little or no strain of the elastomer caused by the creep phenomenon.

Further, the desired value for controlling the output voltage of the power source is set by correcting the desired reference value by a feedback manipulated variable which is determined on the basis of a difference between a desired value of the capacitance of the elastomer and an estimated value thereof such that the difference is approximated to zero.

Thus, if the strain of the elastomer tends to increase due to the creep phenomenon, causing the actual capacitance of the elastomer to depart from a desired capacitance, then the desired value for control will be adjusted so as to suppress the tendency.

Hence, an increase in the strain of the elastomer due to the creep phenomenon will be suppressed by controlling the output of the power source according to the desired value for control.

According to the first aspect of the invention, therefore, the variable stiffness mechanism can be controlled to enable the suppression of an increase in the strain of the dielectric elastomer caused by the creep phenomenon.

In the foregoing first aspect of the invention, more specifically, the configuration for estimating the capacitance of the elastomer may adopt the following configuration.

The power source control unit is configured to control the output of the power source such that the voltage output from the power source becomes a vibration component superimposed voltage, which has a vibration component of a predetermined frequency superimposed over the desired value for control.

Further, the capacitance estimating unit is configured to sequentially carry out, at a predetermined estimation processing cycle synchronized with the vibration component, energizing current sampling for acquiring detection values of the energizing current at a plurality of sampling times in a current reduction period, in which the energizing current of the dielectric elastomer increases and then decreases according to a change of the voltage output from the power source in a case where the voltage changes due to the vibration component, and capacitance estimation processing for determining an estimated value of the capacitance of the dielectric elastomer from a model, which represents a correlation between a time-dependent change in the energizing current of the dielectric elastomer and the capacitance of the dielectric elastomer in the current reduction period, and from the detection values of the energizing current at the plurality of the sampling times (a second aspect of the invention).

It is now assumed that the voltage output from the power source (the voltage applied to the elastomer) is changed relatively suddenly (e.g. in steps). In this case, a transient response phenomenon causes the energizing current of the elastomer to suddenly increase and then to gradually decrease. At this time, during the period in which the energizing current gradually decreases (the current reduction period), the energizing current gradually decreases at a time constant specified on the basis of the value of the capacitance of the elastomer and the resistance value of the current path of the energizing current (the resistance value of a resistance element that can be regarded to be connected in series with the elastomer).

Therefore, the time-dependent change of the actual energizing current of the elastomer in the current reduction period has a high correlation with the capacitance of the elastomer.

Hence, according to the second aspect of the invention, the capacitance estimating unit carries out the energizing current sampling in the current reduction period based on the transient response phenomenon. Thus, the detection values of the energizing current of the elastomer at the plurality of sampling times in the current reduction period are acquired.

Then, the capacitance estimating unit determines an estimated value of the capacitance of the elastomer by the capacitance estimation processing on the basis of the model and the detection values of the energizing current at the plurality of sampling times in the current reduction period.

In this case, the time series of the detection values of the energizing current of the elastomer at the plurality of sampling times has a high correlation with the capacitance of the elastomer, so that the estimated value of the capacitance of the elastomer can be properly determined by the capacitance estimation processing.

Thus, the second aspect of the invention makes it possible to properly estimate the capacitance of the elastomer by variably manipulating the voltage applied to the elastomer.

In the foregoing second aspect of the invention, the vibration component is preferably a square-wave signal (a third aspect of the invention).

With this arrangement, the output voltage of the power source can be changed in steps by the vibration component, thus allowing the transient response phenomenon, which has a high correlation with the capacitance of the elastomer, to markedly occur. This makes it possible to properly estimate the capacitance of the elastomer with high reliability by the processing carried out by the capacitance estimating unit.

In the foregoing second aspect of the invention, in the case where the first member and the second member are provided such that an external force causing the relative displacement between the first member and the second member can be variably applied, the capacitance estimating unit is preferably configured to further include a function for carrying out first processing for sequentially acquiring a first current detection value, which is a detection value of the energizing current immediately before a voltage value of the vibration component changes, in a state in which the voltage output from the power source is being controlled to the vibration component superimposed voltage, and second processing for predicting, based on a plurality of past values of the first current detection value acquired in the first processing, a time-dependent change pattern of the energizing current in the period of each estimation processing cycle, which is a time-dependent change pattern of the energizing current in the case where it is assumed that the voltage value of the vibration component in the period of the estimation processing cycle is continuously maintained at a voltage value immediately before a start of the period of the estimation processing cycle, before the period of the estimation processing cycle is started, and the capacitance estimating unit being configured also to correct, by the capacitance estimation processing at each estimation processing cycle, each of the detection values of the energizing current at the plurality of the sampling times during the current reduction period in the period of the estimation processing cycle, based on a current value at each sampling time specified by the time-dependent pattern predicted by the second processing for the estimation processing cycle, thereby to determine an estimated value of the capacitance of the dielectric elastomer based on a current value after the correction and the model (a fourth aspect of the invention).

With this arrangement, the time-dependent change pattern of the energizing current attributable to a change in the capacitance of the elastomer based on a change in the external force applied to the elastomer can be predicted by the first processing and the second processing. Thus, the components of the energizing current attributable to a change in the capacitance of the elastomer based on a change in the external force can be removed from the detection values of the energizing current at the plurality of sampling times by correcting each of the detection values of the energizing current at the plurality of sampling times in the current reduction period in the period of each estimation processing cycle by the current value at each sampling time specified by the time-dependent change pattern predicted in the second processing.

As a result, even in a situation wherein the external force changes, the capacitance of the elastomer can be estimated with high reliability by determining the estimated value of the capacitance of the elastomer on the basis of the corrected current values and the model.

In the first aspect of the invention, the dielectric elastomer is formed like a sheet and configured such that the applied voltage can be imparted in a direction of a thickness thereof, the dielectric elastomer has a middle portion thereof fixed to the first member and a peripheral part thereof fixed to the second member provided to be relatively movable in the direction of the thickness of the dielectric elastomer with respect to the first member, and the dielectric elastomer is provided in a tensioned state such that the dielectric elastomer is subjected to a tension between the first member and the second member in a state in which the applied voltage is not being imparted (a fifth aspect of the invention).

This arrangement makes it possible to prevent the thickness of the sheet-like elastomer from decreasing due to the creep phenomenon. Thus, even if the thickness of the sheet-like elastomer is relatively small, the damage to the elastomer caused by the creep phenomenon can be properly prevented.

In addition, the elastomer is tensioned between the first member and the second member in the state wherein no voltage is being imparted, thus enabling the stiffness of the elastomer to be changed over an extensive range by manipulating the voltage applied to the elastomer.

DESCRIPTION OF THE PREFERRED EMBODIMENTS

Figure 1:
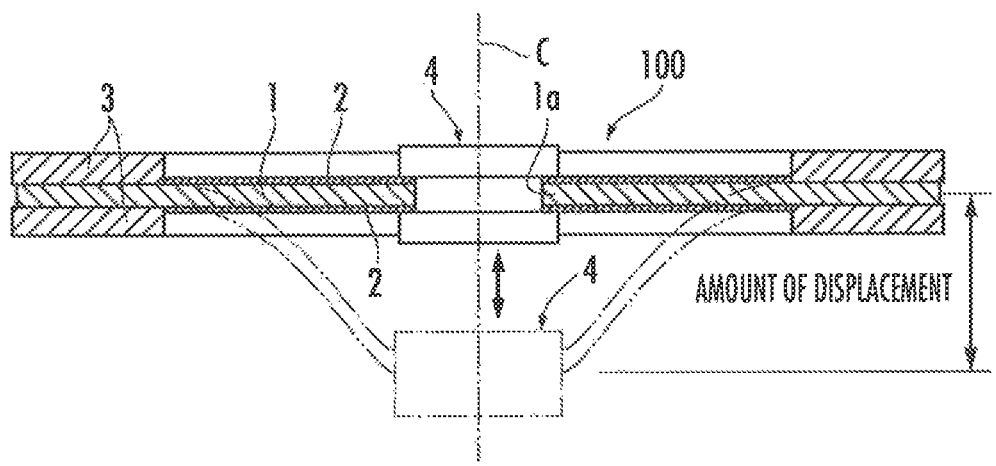
FIG. 1 is a diagram illustrating a variable stiffness mechanism according to an embodiment of the present invention.

An embodiment of the present invention will be described below with reference to FIG. 1 to FIG. 11. Referring to FIG. 1, a variable stiffness mechanism 100 according to the present embodiment has a dielectric elastomer 1 formed like a sheet, frame members 3 attached to a peripheral part of the dielectric elastomer 1 (hereinafter referred to simply as "the elastomer 1"), and a movable member 4 attached to the central part of the elastomer 1 such that the movable member 4 can be relatively moved with respect to the frame members 3.

The frame member 3 and the movable member 4 correspond to the second member and the first member, respectively, in the present invention.

The elastomer 1 can be composed of, for example a silicone resin, a urethane resin, or an acrylic resin. Further, film-like electrodes 2, 2 are firmly fixed to both surfaces in the direction of the thickness of the elastomer 1, covering the surfaces.

The frame members 3 are firmly fixed to the elastomer 1 such that the frame members 3 sandwich the peripheral part of the elastomer 1. In this case, the peripheral part of the elastomer 1 is retained by the frame members 3 in a state in which the elastomer 1 is pulled in the direction along the surfaces (a state in which a pre-tension is being imparted).

The movable member 4 is attached to a hole 1a drilled at the central part of the elastomer 1. Further, the direction of the relative movement of the movable member 4 with respect to the frame members 3 is guided in the direction of a central axis C of the elastomer 1 by a guide mechanism (not illustrated).

In the variable stiffness mechanism 100 having the foregoing configuration, the movable member 4 is displaced in the direction of the central axis C with respect to the frame members 3 to cause the elastomer 1 to warp, as indicated by the two-dot chain line in FIG. 1, and to generate an elastic force for returning the movable member 4 to its original equilibrium position (the position in a non-load state in which no external force that causes the movable member 4 to be relatively displaced with respect to the frame members 3 is being applied).

Further, a voltage is applied to the elastomer 1 through the electrodes 2, 2 (an electric field is generated in the direction of the thickness of the elastomer 1 between the electrodes 2, 2) thereby to compress the elastomer 1 in the thickness direction by the Maxwell stresses. Accordingly, the elastomer 1 is elongated in the direction along the surfaces (the area observed in the thickness direction increases) in the state wherein no external force is being applied (a natural length state).

Hence, in the variable stiffness mechanism 100, wherein the peripheral part of the elastomer 1 is retained by the frame members 3, the tension (pre-tension) of the elastomer 1 between the movable member 4 and the frame members 3 decreases, and the stiffness of the elastomer 1 (the stiffness when the movable member 4 is relatively displaced in the direction of the central axis C with respect to the frame members 3) also decreases.

Figure 2:
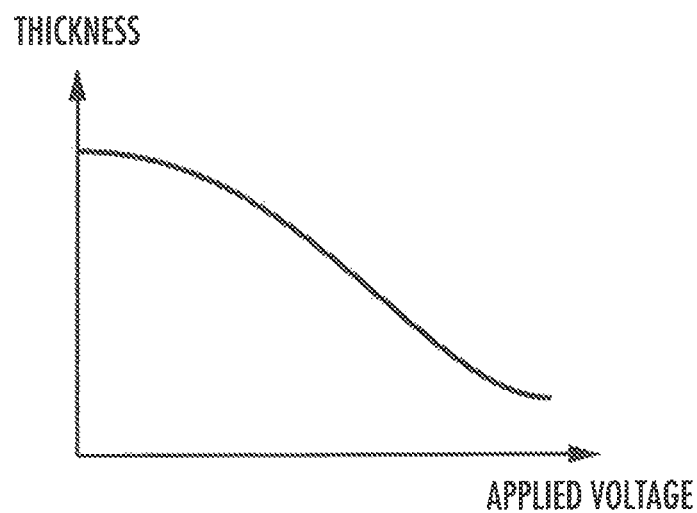
FIG. 2 is a graph illustrating the relationship between an applied voltage and the thickness of a dielectric elastomer.

In this case, the thickness of the elastomer 1 decreases as the applied voltage increases, as illustrated in FIG. 2. Therefore, the stiffness of the elastomer 1 decreases as the applied voltage increases.

Thus, in the variable stiffness mechanism 100, the stiffness of the elastomer 1 between the movable member 4 and the frame members 3 can be variably adjusted by manipulating the voltage applied to the elastomer 1.

Supplementarily, the variable stiffness mechanism 100 may be composed of a plurality of the elastomers 1 stacked between the frame members 3 and the movable member 4.

Meanwhile, the elastomer 1 is an electrical insulator and therefore has a function as a capacitive element (has a capacitance). In this case, basically, the capacitance of the sheet-like elastomer 1 is proportional to the area of the elastomer 1 (the area observed in the thickness direction) and inversely proportional to the thickness of the elastomer 1. Further, the relationship between the thickness and the area of the elastomer 1 in the state wherein no external force is being applied (the natural length state) is basically an inversely proportional relationship. Therefore, the capacitance of the elastomer 1 is basically inversely proportional to the square of the thickness of the elastomer 1.

A supplementary description will be given of the relationship between the creep phenomenon and the capacitance of the elastomer 1. In the variable stiffness mechanism 100 according to the present embodiment, if the creep phenomenon of the elastomer 1 occurs in a state in which the voltage applied to the elastomer 1 and the load applied to the elastomer 1 (a translational external force in the direction of the central axis C applied to the movable member 4) are maintained to be constant, then the strain of the elastomer 1 increases, causing the thickness of the elastomer 1 to gradually decrease. This means that the capacitance of the elastomer 1 will increase as time elapses.

Figure 3:
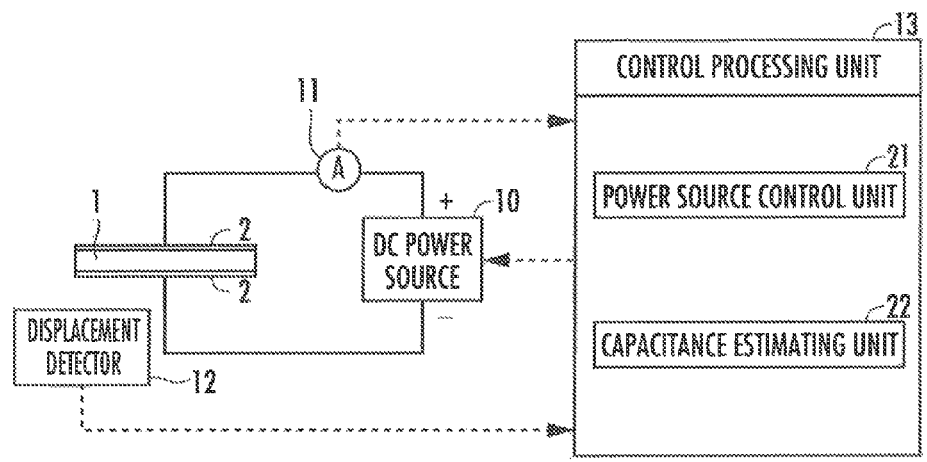
FIG. 3 is a diagram illustrating a total system configuration of a controller of the variable stiffness mechanism according to the embodiment.

FIG. 3 illustrates the system configuration of a controller of the variable stiffness mechanism 100. The system is capable of measuring the capacitance of the elastomer 1 while concurrently variably controlling the stiffness of the elastomer 1 by manipulating the voltage applied to the elastomer 1.

As illustrated, the controller of the variable stiffness mechanism 100 includes a DC power source 10 (corresponding to a power source in the present invention) connected to the electrodes 2, 2 of the elastomer 1, a current detector 11 which detects the energizing current flowing between the DC power source 10 and the elastomer 1, a displacement detector 12, which detects the amount of the relative displacement of the movable member 4 with respect to the frame members 3 and a control processing unit 13. The displacement detector 12 may use, for example, an optical distance measurement sensor or the like.

The DC power source 10 is a power source that outputs a DC voltage between the electrodes 2, 2 of the elastomer 1, and is configured such that the magnitude of the output voltage can be variably controlled to a required desired value. The DC power source 10 has an overcurrent prevention function that prevents the passage of an excessive current. If a current flowing through the DC power source 10 (an output current or an input current) exceeds a predetermined upper limit value, then the current will be forcibly limited to the upper limit value.

A control processing unit 13 is composed of one or a plurality of electronic circuit units, which include a CPU, a RAM, a ROM, an interface circuit and the like. The control processing unit 13 includes a power source control unit 21, which controls the output voltage of the DC power source 10, and a capacitance estimating unit 22, which estimates the capacitance of the elastomer 1, as the functions implemented by a hardware configuration or a program, which is installed therein.

The following will describe in detail the processing carried out by the power source control unit 21 and the capacitance estimating unit 22.

Figure 4:
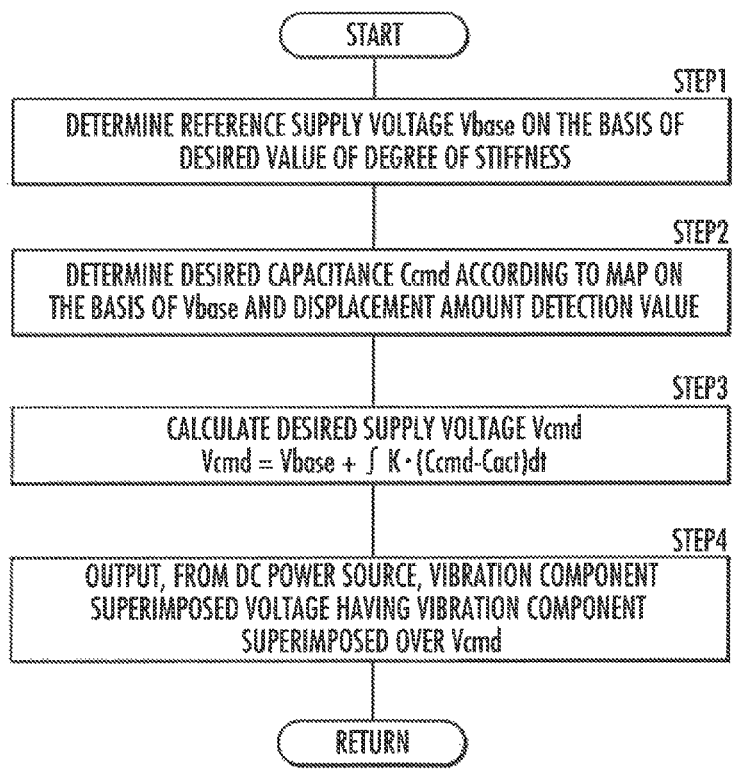
FIG. 4 is a flowchart illustrating the processing by a power source control unit illustrated in FIG. 3.

The power source control unit 21 sequentially carries out the processing illustrated by the flowchart of FIG. 4 at a predetermined control processing cycle. More specifically, the power source control unit 21 determines, in STEP1, a reference supply voltage Vbase, which denotes a desired reference value of the output voltage of the DC power source 10 (the voltage applied to the elastomer 1) according to a desired value of the degree of stiffness of the elastomer 1.

The desired value of the degree of stiffness of the elastomer 1 is appropriately determined by the control processing unit 13 according to an operation request or the like of a device (e.g. a joint mechanism of a robot) on which the variable stiffness mechanism 100 is mounted, or a desired value appropriately given to the control processing unit 13 from an external device.

The desired value of the degree of stiffness may be, for example, the desired value of the sensitivity of a change in the elastic force of the elastomer 1 with respect to a change in the amount of displacement of the movable member 4, i.e. a translational elastic force that moves the movable member 4 in the direction of the central axis C, (a sensitivity corresponding to a so-called spring constant), or the desired value of a reciprocal value of the sensitivity.

Further, the reference supply voltage Vbase denotes a voltage value having a relationship with a desired value of the degree of stiffness of the elastomer 1 determined in advance, the voltage value being used as a reference value of the voltage to be applied to the elastomer 1 to reach a desired value of the degree of stiffness of the elastomer 1.

Then, in STEP1 the reference supply voltage Vbase is determined according to, for example, an arithmetic expression or a data table or the like prepared in advance on the basis of experiments or the like from a desired value of the degree of stiffness of the elastomer 1. In this case, according to the present embodiment, the stiffness of the elastomer 1 decreases as the voltage applied to the elastomer 1 increases. Hence, the reference supply voltage Vbase is determined to be higher as the stiffness of the elastomer 1 indicated by the desired value of the degree of stiffness of the elastomer 1 becomes lower.

Figure 5:
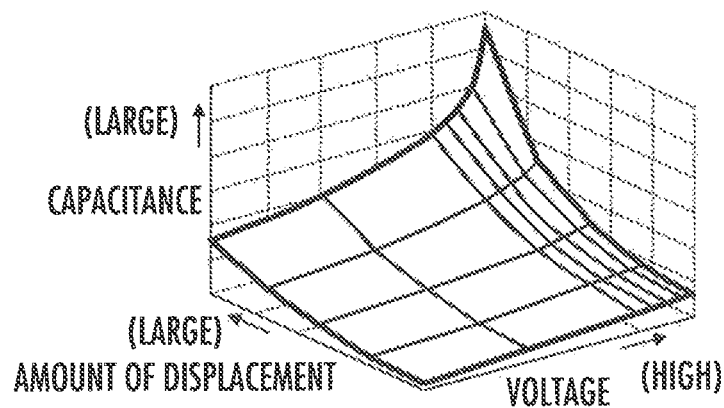
FIG. 5 is a diagram illustrating a map used in STEP2 of FIG. 4.

Subsequently, in STEP2, the power source control unit 21 determines the desired value of the capacitance of the elastomer 1 (hereinafter referred to as "the desired capacitance Ccmd") according to a map prepared in advance, as illustrated in FIG. 5, on the basis of the detection value of the present amount of the relative displacement of the movable member 4 indicated by an output of the displacement detector 12 (hereinafter referred to simply as "the displacement amount detection value") and the reference supply voltage Vbase determined in STEP1.

More specifically, the desired capacitance Ccmd determined in STEP2 corresponds to the value of the capacitance of the elastomer 1 obtained in a state, in which a time-dependent reduction in the thickness of the elastomer 1 attributable to the creep phenomenon of the elastomer 1 has not occurred or has hardly proceeded, in the case where the amount of the relative displacement of the movable member 4 is maintained at the same amount of displacement as the present displacement amount detection value and the reference supply voltage Vbase is applied to the elastomer 1.

The map of FIG. 5 is prepared in advance on the basis of experiments or the like to indicate the relationship among the voltage applied to the elastomer 1, the amount of the relative displacement of the movable member 4, and the capacitance (the capacitance obtained in the state, in which a time-dependent reduction in the thickness of the elastomer 1 attributable to the creep phenomenon of the elastomer 1 has not occurred or has hardly proceeded). According to the map, the capacitance of the elastomer 1 increases as the voltage applied to the elastomer 1 increases or the amount of the displacement of the movable member 4 increases.

Subsequently, in STEP3, the power source control unit 21 corrects the reference supply voltage Vbase according to expression (1) given below on the basis of a difference between the desired capacitance Ccmd determined in STEP2 and the estimated value of an actual capacitance Cact of the elastomer 1 obtained by the capacitance estimating unit 22 (the details of which will be discussed hereinafter), thereby determining a desired supply voltage Vcmd, which is the desired value for controlling the output voltage of the DC power source 10.

$$Vcmd = Vbase + \int (K \cdot (Ccmd - Cact)) dt \qquad (1)$$

where "K" of the second term of the right side of expression (1) denotes a gain having a predetermined value.

The second term of the right side of expression (1) denotes a feedback manipulated variable that functions to converge the difference between the desired capacitance Ccmd of the elastomer 1 and the estimated value of the actual capacitance Cact thereof to zero. In the present embodiment, the feedback manipulated variable is calculated by the integration rule.

Hence, the desired supply voltage Vcmd is determined to have a value obtained by correcting the reference supply voltage Vbase so as to suppress the actual capacitance Cact of the elastomer 1 from deviating from the desired capacitance Ccmd.

Thus, if the thickness of the elastomer 1 tends to decrease due to the creep phenomenon of the elastomer 1, causing the value of the capacitance Cact to increase to be larger than the desired capacitance Ccmd, then the desired supply voltage Vcmd is determined to be a voltage value that is smaller than the reference supply voltage Vbase.

Further, the value of the gain K of the second term of the right side of expression (1) in the present embodiment is variably set according to the reference supply voltage Vbase such that the value of the gain K increases as the reference supply voltage Vbase increases. This is because of the following reason.

Figure 6:
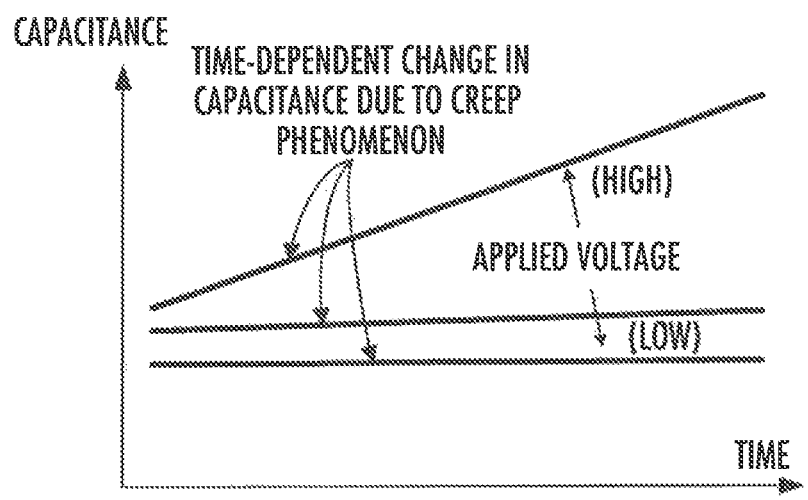
FIG. 6 is a graph illustrating the time-dependent change in capacitance attributable to the creep phenomenon.

The increasing rate of the strain of the elastomer 1 caused by the creep phenomenon (i.e. the reducing rate of the thickness) tends to increase as the voltage applied to the elastomer 1 increases. Therefore, the increasing rate of the capacitance of the elastomer 1 caused by the creep phenomenon increases as the voltage applied to the elastomer 1 increases, as illustrated in FIG. 6. For this reason, in the present embodiment, the power source control unit 21 variably sets the value of the gain K according to the reference supply voltage Vbase in order to enhance the effect for bringing the actual capacitance Cact to the desired capacitance Ccmd as the reference supply voltage Vbase increases, as described above.

Next, in STEP4, the power source control unit 21 controls the DC power source 10 so as to output, from the DC power source 10, a voltage having the vibration component of a predetermined frequency superimposed over the desired supply voltage Vcmd calculated in STEP3 (hereinafter referred to as "the vibration component superimposed voltage").

Figure 7:
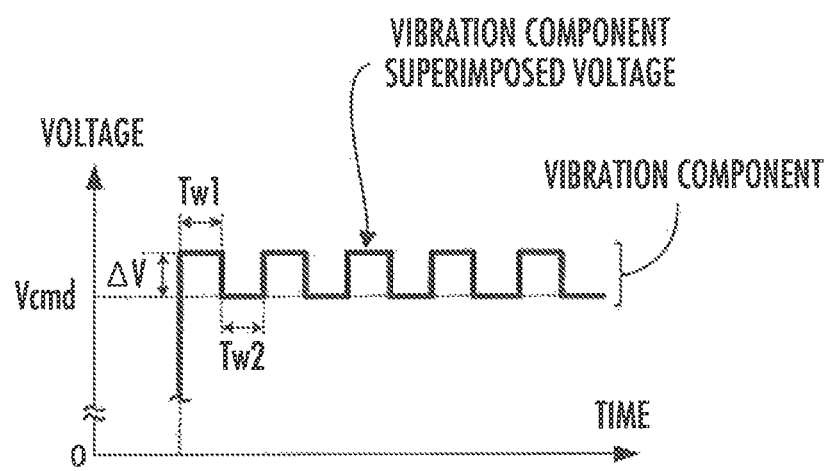
FIG. 7 is a diagram illustrating the waveform of a vibration component superimposed voltage, which has a vibration component superimposed thereon.

The vibration component is a voltage signal added to the desired supply voltage Vcmd in order to estimate the capacitance Cact of the elastomer 1. The vibration component in the present embodiment is a square-wave voltage signal having a predetermined amplitude ΔV, as illustrated in FIG. 7. For the sake of illustrative convenience, FIG. 7 illustrates the time-dependent change in the voltage value of the vibration component superimposed voltage in the case where the desired supply voltage Vcmd is increased to a certain value and then maintained at a constant value.

The vibration component is a voltage signal having an amplitude which is sufficiently small as compared with the variable width of the desired supply voltage Vcmd (or the variable width of the reference supply voltage Vbase), and the mean voltage value per cycle thereof is zero or substantially zero.

More specifically, the amplitude ΔV of the square-wave vibration component is set in advance on the basis of experiments or the like such that the change in the thickness of the elastomer 1 based on a voltage change in the amplitude ΔV will be sufficiently small so as not to substantially influence the degree of stiffness of the elastomer 1.

Figure 8:
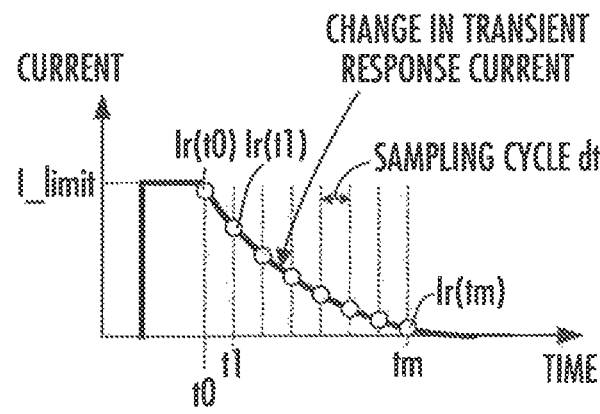
FIG. 8 is a graph illustrating the time-dependent change in the energizing current of the dielectric elastomer caused by a transient response phenomenon.

Further, a pulse width Tw1 from a rise timing (voltage increase timing) of the vibration component to a following fall timing (voltage decrease timing) thereof and a pulse width Tw2 from the fall timing to the following rise timing are set in advance by experiments or the like such that the current flowing between the elastomer 1 and the DC power source 10 (a transient response current attributable to the output voltage of the DC power source 10 changing in steps) sufficiently decreases, as illustrated in FIG. 8, within the time of each of the pulse widths. For example, it is possible to set Tw1 and Tw2 on the basis of the value of a reduction time constant calculated from the maximum value of the capacitance that can be obtained by the deformation of the elastomer 1 and the resistance value (e.g. the resistance value of the electrodes 2, 2) of a current path between the elastomer 1 and the DC power source 10, or to set Tw1 and Tw2 on the basis of the actual measurement value of the transient response current observed when a DC voltage of a maximum step width is applied to the elastomer 1 from the DC power source 10 in a state in which the amount of relative displacement of the movable member 4 is set to a maximum. Tw1 and Tw2 may have the same time width.

Further, the cycle of the vibration component (=Tw1+Tw2) is set to a time width that is shorter than the change cycle of the desired value of the degree of stiffness of the elastomer 1 (the change cycle of the reference supply voltage Vbase). This is because a large current flows to the elastomer 1 when the steady desired value of the DC power source 10 is changed so as to change the degree of stiffness of the elastomer 1, and the processing for estimating the capacitance of the elastomer 1 carried out by the capacitance estimating unit 22 is susceptible to the influence of, for example, the current limitation by the overcurrent prevention function of the DC power source 10.

Supplementarily, in the example illustrated in FIG. 7, the vibration component is superimposed over the desired supply voltage Vcmd such that the value of the vibration component superimposed voltage changes between the desired supply voltage Vcmd and the voltage value obtained by adding Vcmd and ΔV. Alternatively, however, the vibration component may be superimposed over the desired supply voltage Vcmd such that the value of the vibration component superimposed voltage changes between, for example, the desired supply voltage Vcmd and the voltage value obtained by subtracting ΔV from Vcmd, (i.e. Vcmd−(ΔV/2)), or changes between the voltage value obtained by subtracting (ΔV/2) from Vcmd and the voltage value obtained by adding Vcmd and (ΔV/2), (i.e. Vcmd+(ΔV/2)).

The power source control unit 21 controls the output voltage of the DC power source 10 to the vibration component superimposed voltage having the vibration component superimposed over the desired supply voltage Vcmd calculated in the foregoing STEP3, as described above.

Supplementarily, in the present embodiment, the feedback manipulated variable, which is used to correct the reference supply voltage Vbase in the foregoing STEP3, has been calculated according to the integration rule on the basis of the difference between the desired capacitance Ccmd and the estimated value of the actual capacitance Cact. Alternatively, however, the feedback manipulated variable may be determined using a different feedback control rule, such as the proportional-integral rule (the PI control rule), the proportional-differential rule (the PD control rule), or the proportional-integral-differential rule (PID control rule).

The processing for estimating the capacitance Cact by the capacitance estimating unit 22 will now be described in detail. In the following description, the capacitance C will mean the actual capacitance Cact (or the estimated value thereof) of the elastomer 1 unless otherwise specified.

The capacitance estimating unit 22 carries out the processing for estimating the capacitance of the elastomer 1 for each period of each of the pulse widths Tw1 and Tw2 of the vibration component (at the estimation processing cycle synchronized with the vibration component) in the state wherein the vibration component superimposed voltage is being output from the DC power source 10. In this case, the capacitance estimating unit 22 carries out the processing for acquiring and storing in memory the detection value of the energizing current of the elastomer 1 indicated by the output of the current detector 11 (hereinafter referred to simply as the current detection value) during a predetermined period of the periods of the pulse width Tw1 and the pulse width Tw2 of the vibration component (hereinafter referred to as the energizing current sampling).

If the value of the vibration component superimposed voltage suddenly changes in steps due to the vibration component of the vibration component superimposed voltage output from the DC power source 10, then the transient response phenomenon causes the energizing current of the elastomer 1 to suddenly increase and then to gradually decrease at a time constant specified on the basis of the value of a capacitance C of the elastomer 1, which is the capacitance value of the current path of the energizing current, and a resistance value R of the current path ($=1/(R \cdot C)$).

The energizing current becomes a current in a direction for increasing the charges stored in the elastomer 1 in the case where the magnitude of the vibration component superimposed voltage increases in steps, or becomes a current in a direction for decreasing the charges stored in the elastomer 1 in the case where the magnitude of the vibration component superimposed voltage decreases in steps.

Hereinafter, the energizing current of the elastomer 1, which exhibits the time-dependent change in a pattern in which the energizing current suddenly increases and then gradually decreases due to the transient response phenomenon attributable to the stepped change in the output voltage of the DC power source 10 as described above, will be referred to as the transient response current. Further, the period in which the current value of the transient response current gradually decreases will be referred to as the current reduction period.

FIG. 7 illustrates the time-dependent change of the transient response current. The current value of the transient response current suddenly increases immediately after the stepped change in the output voltage of the DC power source 10. Hence, the overcurrent prevention function of the DC power source 10 frequently forcibly limits the current value of the transient response current immediately after the stepped change in the output voltage of the DC power source 10 to an upper limit value I_limit. The graph of the time-dependent change of the transient response current in FIG. 7 illustrates the time-dependent change of the transient response current when the current value is limited to the upper limit value I_limit immediately after the stepped change of the output voltage of the DC power source 10 as described above. If the amount of the stepped change in the output voltage of the DC power source 10 is relatively small, then the current value of the transient response current may rise to an original peak value rather than being limited to the upper limit value I_limit.

The time constant at which the current value of the transient response current gradually decreases depends on the capacitance C of the elastomer 1 and the resistance value R of the current path of the energizing current of the elastomer 1, as described above. Accordingly, the time-dependent change of the current value in the current reduction period of each of the pulse widths Tw1 and Tw2 of the vibration component has a correlation with the capacitance C.

Hence, in the energizing current sampling, the capacitance estimating unit 22 acquires, in a time series manner, the current detection values at a plurality of sampling times in the current reduction period for each of the periods of the pulse widths Tw1 and Tw2 of the vibration component.

Specifically, referring to FIG. 7, when the period of each of the pulse widths Tw1 and Tw2 of the vibration component begins, the capacitance estimating unit 22 starts to sequentially monitor the current detection value, which is indicated by the output of the current detector 11, at a predetermined sampling cycle dt. The start timing of each of the pulse widths Tw1 and Tw2 of the vibration component is given to the capacitance estimating unit 22 from the power source control unit 21. Further, the sampling cycle dt is a preset value of a time width that is sufficiently shorter than each of the pulse widths Tw1 and Tw2 of the vibration component.

When the capacitance estimating unit 22 detects the start timing of the current reduction period (time t0 in FIG. 7) by the monitoring of the current detection value, the capacitance estimating unit 22 stores and retains in a memory, in the time series manner, current detection values Ir(t0), Ir(t1), . . . , Ir(tm) at sampling times t0, t1, . . . , tm for a predetermined period (the period of $m \cdot dt$) until the sampling cycle dt of a predetermined number m elapses from the sampling time (t0) at that time. Thus, the capacitance estimating unit 22 acquires the time series of a (m+1) number of current detection values Ir(t0), Ir(t1), . . . , Ir(tm) of the transient response current in the current reduction period of each of the pulse widths Tw1 and Tw2 of the vibration component.

The predetermined number m and the sampling cycle dt are desirably set to have a relationship denoted by $\tau\_min \leq m \cdot dt \leq \tau\_max$ with respect to a minimum value $\tau\_min$ and a maximum value $\tau\_max$, which can be predicted as the values of the time constant of the reduction in the current value of the transient response current (i.e. desirably set such that the time width from the sampling time 0t, at which the storing and retaining of the current detection value is started, to the sampling time tm, at which the storing and retaining of the current detection value is ended ($=m \cdot dt$) becomes a time width within the range between $\tau\_min$ and $\tau\_max$).

The graph illustrating the time-dependent change of the transient response current in FIG. 7 more specifically illustrates a transient current change in the case where the output voltage of the DC power source 10 changes in steps while the capacitance C of the elastomer 1 is being maintained to be constant.

Meanwhile, according to the present embodiment, the elastomer 1 is elastically deformed according to a change in an external force applied to the movable member 4 (i.e. an external force that causes the movable member 4 to be displaced in the direction of the central axis C with respect to the frame members 3), thus causing the capacitance C of the elastomer 1 to be also changed. Therefore, in the situation wherein the external force applied to the movable member 4 changes, the energizing current of the elastomer 1 changes as illustrated by the dashed-line graph of FIG. 9A even if the output voltage of the DC power source 10 takes a constant value that does not include the vibration component.

Figure 9A:
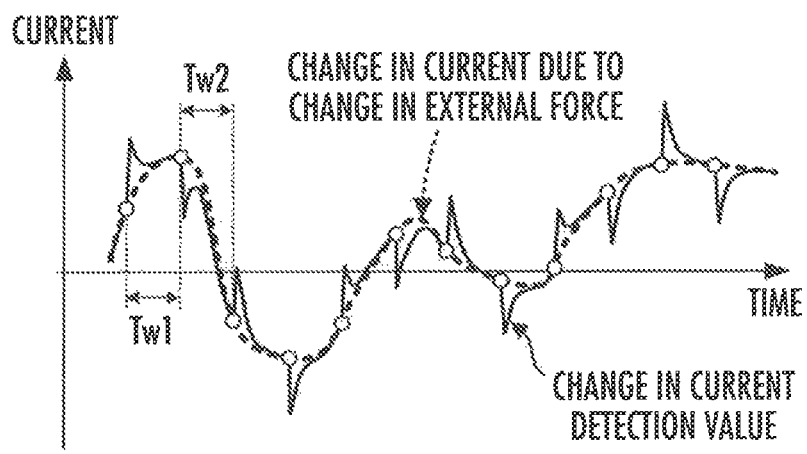
FIG. 9A and FIG. 9B are explanatory diagrams related to the processing for correcting the detection value of the energizing current of the dielectric elastomer.

Further, if the vibration component superimposed voltage is output from the DC power source 10 in the situation wherein the external force applied to the movable member 4 changes, then the actual energizing current of the elastomer 1 in each of the pulse widths Tw1 and Tw2 of the vibration component will be, for example, a current that combines a current component, which changes due to the elastic deformation of the elastomer 1 caused by a change in the external force applied to the movable member 4, and the transient response current illustrated in FIG. 7, as illustrated by the solid-line graph of FIG. 9A.

For convenience in understanding, the solid-line graph of FIG. 9A schematically illustrates the mode of the time-dependent change of the energizing current of the elastomer 1 in a situation wherein the transient response current is not being limited by the overcurrent prevention function of the DC power source 10. Further, each blank dot on the solid-line graph of FIG. 9A denotes the current value at the start timing of each of the pulse widths Tw1 and Tw2 of the vibration component.

Supplementarily, if the actual energizing current of the elastomer 1 in the period of each of the pulse widths Tw1 and tw2 of the vibration component includes a current component that changes due to the elastic deformation of the elastomer 1 caused by a change in an external force applied to the movable member 4, then the current detection value indicated by the output of the current detector 11 may switch from a decreasing trend to an increasing trend after the current detection value starts to decrease in the current reduction period of the transient response current. However, in the energizing current sampling, after detecting the start timing of the current reduction period (the start timing of the gradual decrease of the current detection value), the capacitance estimating unit 22 regards that the current reduction period will continue, and stores and retains the time series of the (m+1) number of the current detection values in a memory.

In the situation wherein the elastomer 1 elastically deforms due to the change in the external force applied to the movable member 4, the actual energizing current (eventually the current detection value) of the elastomer 1 will include a current component, which is attributable to the elastic deformation of the elastomer 1 caused by a change in the external force, in addition to the transient response current, as described above. In this case, it is difficult to properly estimate the capacitance C of the elastomer 1 by directly using the current detection value in the current reduction period.

According to the present embodiment, therefore, the capacitance estimating unit 22 carries out processing for correcting each of the (m+1) number of current detection values so as to eliminate a current component that changes due to the elastic deformation of the elastomer 1 caused by a change in the external force from each of the (m+1) number of current detection values stored and retained in the memory in the time series manner in the current reduction period of each of the pulse widths Tw1 and Tw2 of the vibration component.

In this correction processing, the capacitance estimating unit 22 sequentially stores and retains, in the memory in the time series manner, the current detection values (hereinafter referred to as the first current detection values) acquired at the sampling time immediately before the start of each of the pulse widths Tw1 and Tw2 (in other words, the sampling time immediately before the end of each of the pulse widths Tw1 and Tw2) of the vibration component in the state wherein the vibration component superimposed voltage is being output from the DC power source 10. In this case, the first current detection values stored and retained in the memory are a plurality of current detection values for a predetermined period from the latest sampling time to a predetermined time.

The time series of the first current detection values corresponds to a time series of the current detection values that include little or none of the transient response current, and therefore corresponds to the time series of the current detection values on the dashed-line graph of FIG. 9A. Thus, the time series of the first current detection values indicates a change in the energizing current of the elastomer 1 attributable to the elastic deformation of the elastomer 1 caused by a change in the external force.

Then, based on the time series of the first current detection values for the predetermined period, the capacitance estimating unit 22 identifies, by using, for example, the extrapolation method, the time-dependent change pattern of the estimated value of the energizing current of the elastomer 1 (hereinafter referred to as the predicted reference current value) in the case where it is assumed that the output voltage of the DC power source 10 in the period of the pulse width Tw1 or Tw2 that newly starts is maintained at a voltage value immediately before the start of the period of the pulse width Tw1 or Tw2 that newly starts (in the case where it is assumed that the stepped change in the output voltage of the DC power source 10 will not occur).

In this case, the time series of the first current detection values for the predetermined period is approximated by, for example, a function expression, such as a polynomial function (a cubic function or the like) having time as a variable. By the approximate functional equation, the time-dependent change pattern of the predicted reference current value in the period of the pulse width Tw1 or Tw2 (Tw2 in the illustrated example) that newly starts is estimated, as indicated by the dashed-line graph of FIG. 9B.

Further, the capacitance estimating unit 22 calculates, according to the approximate functional equation, the predicted reference current value at each sampling time during the period of the newly started pulse width Tw1 or Tw2. Subsequently, the capacitance estimating unit 22 subtracts the predicted reference current value at each sampling time in the current reduction period of the period of the newly started pulse width Tw1 or Tw2 from the current detection value at that sampling time, thereby correcting the current detection value. The current value after the correction is stored and retained in the memory in the time series manner as the current value that indicates the current value of the transient response current in the current reduction period.

Figure 9B:
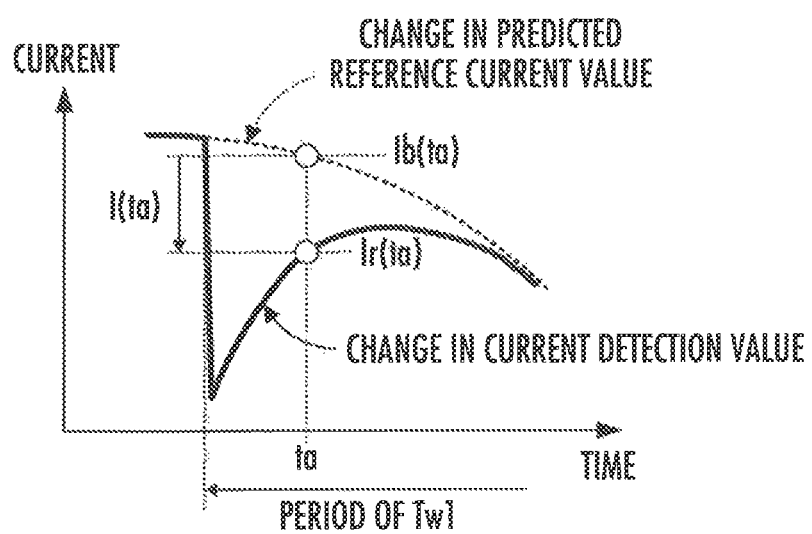

For example, as illustrated in FIG. 9B, a current value I(ta) obtained by subtracting a predicted reference current value Ib(ta) at a sampling time ta from a current detection value Ir(ta) at that time is determined as the current value of the transient response current at the sampling time ta.

As described above, the time series I(t0), I(t1), . . . , I(tm) of the (m+1) number of the current values of the transient response current in the current reduction period is obtained for each period of the pulse width Tw1 or Tw2 by correcting the current detection value at each sampling time in the period of the pulse width Tw1 or Tw2 of the vibration component by the predicted reference current value.

The capacitance estimating unit 22 carries out the capacitance estimation processing for estimating the capacitance C by using the (m+1) number of the current values I(t0), I(t1), . . . , I(tm), which have been acquired for each period of the pulse width Tw1 or Tw2 of the vibration component as described above (i.e. the current values obtained by correcting the current detection values at the (m+1) number of sampling times in the current reduction period by the predicted reference current values), and a model that represents the correlation between the time-dependent change in the transient response current in the current reduction period and the time-dependent change in the capacitance C of the elastomer 1.

In this case, the model is configured, for example, as described below. The time-dependent change of the current value of the transient response current in the current reduction period, especially a current value I(t) at a time after the time t0 can be approximated by a polynomial function (the polynomial function of a degree "s"), as indicated by expression (2) given below.

$$I(t)=\theta 0+\theta 1\cdot(t-t0)+\theta 2\cdot(t-t0)^2+\ldots+\theta s\cdot(t-t0)^s \quad (2)$$

Further, the current value I(t) at a time after the time t0 changes in an exponential manner at a time constant specified by the resistance value R of the current path between the elastomer 1 and the DC power source 10 and the capacitance C of the elastomer 1 (=1/(R·C)). In this case, when the exponential change is approximated by the polynomial function of the degree "s", as with expression (2), the current value I(t) is denoted by expression (3) given below.

$$I(t) = \frac{(\Delta V0 - \Delta V(t0))}{R} \cdot \sum_{j=0}^{s} \frac{(-1)^j}{j!\cdot(R\cdot C)^j} \cdot (t-t0)^j \quad (3)$$

where $\Delta V0$ denotes the stepped voltage change amount of the output voltage (the vibration component superimposed voltage) of the DC power source 10 at the start timing of the pulse width Tw1 or Tw2 of the vibration component, and $\Delta V(t0)$ denotes the voltage change amount from the start timing of the pulse width Tw1 or Tw2 to the time t0. In the state wherein the transient response current is not limited by the overcurrent prevention function of the DC power source 10, the $\Delta V(t0)$ is zero ($\Delta V(t0)=0$), but in the state wherein the transient response current is forcibly limited to the upper limit value I_limit or less by the overcurrent prevention function of the DC power source 10, the $\Delta V(t0)$ is not zero ($\Delta V(t0)\neq 0$).

"j !" of each term of $\Sigma$ of the right side of expression (3) means the factorial of an integer value j (j=0, 1, ..., s).

Accordingly, coefficients $\theta 0, \theta 1, \ldots, \theta s$ of the right side of expression (3) have a relationship denoted by expression (4) given below with the capacitance C and the resistance value R.

$$\begin{bmatrix} \theta 0 \\ \theta 1 \\ \vdots \\ \theta s \end{bmatrix} = \begin{bmatrix} \frac{(\Delta V - \Delta V(t0))}{R} \\ \frac{(\Delta V - \Delta V(t0))}{R} \cdot \frac{(-1)}{R\cdot C} \\ \vdots \\ \frac{(\Delta V - \Delta V(t0))}{R} \cdot \frac{(-1)^s}{s!\cdot(R\cdot C)^s} \end{bmatrix} \quad (4)$$

Meanwhile, when an attention is focused on the amount of change in the current value of the transient response current in the current reduction period from the current value I(t0) at the time t0, expression (5) given below is obtained for the (m+1) number of the current values I(t0), I(t1), ..., I(tm). In expression (5), $\uparrow\Delta Im$ and $\uparrow\Delta\Theta$ denote vectors (vertical vectors) defined by expressions (5a) and (5b), respectively, and Mtm denotes a matrix defined by expression (5c) by using the sampling cycle dt of a current detection value in the current reduction period.

$$\uparrow\Delta Im = Mtm \cdot \uparrow\Theta \quad (5)$$

where $$\uparrow\Delta Im \equiv \begin{bmatrix} I(t1) - I(t0) \\ I(t2) - I(t0) \\ \vdots \\ I(tm) - I(t0) \end{bmatrix} \quad (5a)$$

$$\uparrow\Theta \equiv \begin{bmatrix} \theta 1 \\ \theta 2 \\ \vdots \\ \theta s \end{bmatrix} \quad (5b)$$

$$Mtm \equiv \begin{bmatrix} dt & dt^2 & \ldots & dt^s \\ 2\cdot dt & (2\cdot dt)^2 & \ldots & (2\cdot dt)^s \\ \vdots & \vdots & \ddots & \vdots \\ m\cdot dt & (m\cdot dt)^2 & \ldots & (m\cdot dt)^s \end{bmatrix} \quad (5c)$$

Therefore, based on expression (5), expression (6) given below for calculating $\uparrow\Theta$ can be obtained from the (m+1) number of the current values I(t0), I(t1), ..., I(tm).

$$\uparrow\Theta = (Mtm)^{-1} \cdot \uparrow\Delta Im \quad (6)$$

If m=s, then $(Mtm)^{-1}$ denotes an inverse matrix in an ordinary sense, and if m>s, then $(Mtm)^{-1}$ denotes a pseudo-inverse matrix.

Further, based on expression (4) given above, the relationship between $\uparrow\Theta$ and the capacitance C and the resistance value R is denoted by expression (7) given below. $\uparrow\Delta RC$ denotes a vector (vertical vector) defined by expression (7a).

$$\uparrow\Theta = \uparrow\Delta RC \quad (7)$$

where $$\uparrow\Delta RC \equiv \begin{bmatrix} \frac{(\Delta V - \Delta V(t0))}{R} \cdot \frac{(-1)}{R\cdot C} \\ \frac{(\Delta V - \Delta V(t0))}{R} \cdot \frac{(-1)^2}{2!\cdot(R\cdot C)^2} \\ \vdots \\ \frac{(\Delta V - \Delta V(t0))}{R} \cdot \frac{(-1)^s}{s!\cdot(R\cdot C)^s} \end{bmatrix} \quad (7a)$$

Therefore, from expressions (6) and (7), the values of the capacitance C and the resistance value R can be determined.

Hence, according to the present embodiment, in the capacitance estimation processing for each period of the pulse width Tw1 or Tw2 of the vibration component, the capacitance estimating unit 22 estimates the capacitance C by using expressions (6) and (7) given above as the model that represents the correlation between the time-dependent change in the transient response current and the capacitance C of the elastomer 1 in the current reduction period.

More specifically, the capacitance estimating unit 22 calculates the vector $\uparrow\Theta$ having the coefficients $\theta 1, \theta 2, \ldots, \theta s$ of the polynomial function of expression (2) as the components thereof according to expression (6) given above by using the (m+1) number of the current values I(t0), I(t1), ..., I(tm) acquired by the energizing current sampling and the correction processing during the period of the pulse width Tw1 or Tw2 of the vibration component. In this case, the value of the sampling cycle dt is a fixed value set in advance.

Then, the capacitance estimating unit 22 calculates, together with the resistance value R, the capacitance C that satisfies (or substantially satisfies) the relationship of expression (7) with respect to the calculated vector ↑Θ. In this case, if the set value of the degree "s" of the polynomial function of expression (2) is equal to 2 (s=2), then the two expressions given by expression (7) can be used as a simultaneous equation to calculate the capacitance C and the resistance value R.

Further, if the set value of the degree "s" is greater than 2 (s>2), then the values of the capacitance C and the resistance value R can be determined by an appropriate search processing technique or the like such that the square value of a vector (↑Θ−↑ΔRC) (=|↑Θ−↑ΔRC|$^2$) is minimized.

The ΔV0 in expression (7) takes a value that combines the change amount of the steady desired value Vb and the amount of voltage change ΔV attributable to the vibration component in the case where the start timing of each of the pulse width Tw1 or Tw2 of the vibration component coincides with the change timing of the steady desired value Vb (i.e. the change timing of the degree of stiffness of the elastomer 1). Further, if the start timing of each of the pulse width Tw1 or Tw2 of the vibration component is a timing in the state wherein the steady desired value Vb is a constant value, then the value of ΔV0 in expression (7) coincides with the amount of voltage change ΔV attributable to the vibration component.

Further, the value of ΔV(t0)/R in expression (7) is determined, for example, as described below. Among the current detection values at each of the sampling times after the start timing of the pulse width Tw1 or Tw2 of the vibration component, the current detection value at a sampling time immediately before the upper limit value I_limit is reached is determined as the value of ΔV(t0)/R in expression (7).

Alternatively, the voltage applied to the elastomer 1 at the sampling time immediately before the current detection value reaches the upper limit value I_limit may be detected by an appropriate voltage sensor and the voltage detection value may be determined as the value of ΔV(t0).

The resistance value R can be actually measured in advance in an experimental manner.

The processing by the capacitance estimating unit 22 is carried out as described above. By this processing, the estimated values of the capacitance C of the elastomer 1 are determined on the basis of the current values I(t0), I(t1), . . . , I(tm) obtained by correcting the current detection values Ir(t0), r(t1), . . . , Ir(tm) in the current reduction period of the transient response current for each period of the pulse width Tw1 or Tw2 of the vibration component (i.e. for each time the output voltage of the DC power source 10 changes in steps).

According to the present embodiment, the power source control unit 21 calculates the desired supply voltage Vcmd by using the capacitance C of the elastomer 1 obtained as described above (=Cact) in the processing of the foregoing STEP3.

According to the embodiment described above, the desired supply voltage Vcmd, which takes the voltage value obtained by removing the vibration component from the vibration component superimposed voltage output from the DC power source 10, is determined to take the value obtained by correcting the reference supply voltage Vbase, which is determined on the basis of the desired value of the degree of stiffness of the elastomer 1, by the feedback manipulated variable based on the difference between the desired capacitance Ccmd of the elastomer 1 and the estimated value of the actual capacitance Cact (the integrated value of the difference in the present embodiment).

Thus, the output voltage of the DC power source 10 is controlled to suppress the estimated value of the actual capacitance Cact of the elastomer 1 from deviating from the desired capacitance Ccmd.

As a result, if the creep phenomenon of the elastomer 1 causes the actual thickness of the elastomer 1 to tend to decrease to a thickness that is smaller than the original thickness thereof specified by a pair of the actual amount of the relative displacement (the displacement amount detection value) of the movable member 4 and the reference supply voltage Vbase determined on the basis of the desired value of the degree of stiffness of the elastomer 1 (thus leading to the tendency of the actual capacitance Cact to increase to a capacitance value that is larger than the desired capacitance Ccmd), then the desired supply voltage Vcmd is decreased so as to suppress the decrease in the thickness of the elastomer 1.

Figure 10:
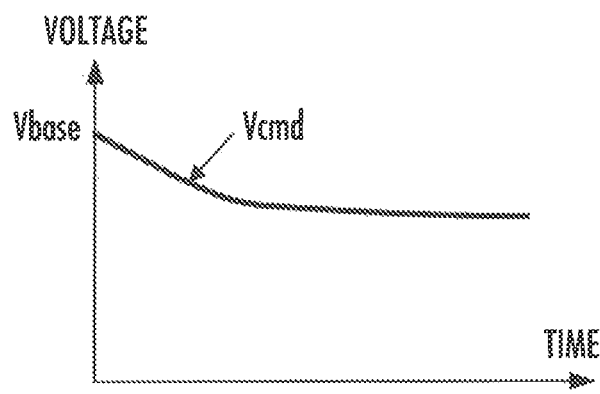
FIG. 10 is a graph illustrating a time-dependent change in a desired supply voltage in the embodiment.

Actually, the observation of the time-dependent change of the desired supply voltage Vcmd in a state in which the load on the elastomer 1 (the translational external force in the direction of the central axis C with respect to the movable member 4) and the reference supply voltage Vbase are both maintained at fixed values (i.e. a state in which the desired capacitance Ccmd is maintained at a constant value) indicates the desired supply voltage Vcmd changing as illustrated in, for example, FIG. 10 due to the occurrence of the creep phenomenon of the elastomer 1.

As described above, the desired supply voltage Vcmd is decreased to suppress the reduction in the thickness of the elastomer 1 caused by the creep phenomenon, thus preventing a further reduction in the thickness of the elastomer 1. As a result, damage to the elastomer 1 can be prevented.

Figure 11:
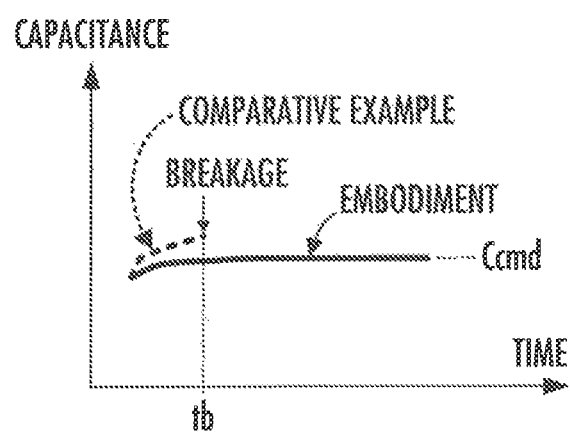
FIG. 11 is a graph illustrating time-dependent changes in the capacitance of the dielectric elastomer related to the embodiment and a comparative example.

FIG. 11 is a graph illustrating time-dependent changes of the estimated value of the actual capacitance Cact of the elastomer 1 (a graph of the embodiment and a comparative example). More specifically, the solid-line graph (the graph illustrating the embodiment) of FIG. 11 is a graph illustrating the time-dependent change in the estimated value of the capacitance Cact in the case where the DC power source 10 is controlled using the desired supply voltage Vcmd calculated according to the foregoing expression (1) in the state in which the load on the elastomer 1 (the translational external force in the direction of the central axis C with respect to the movable member 4) and the reference supply voltage Vbase are set at constant values.

Further, the dashed-line graph (the graph illustrating the comparative example) of FIG. 11 is a graph illustrating the time-dependent change in the estimated value of the capacitance Cact in the case where the DC power source 10 is controlled using the desired supply voltage Vcmd, which consistently coincides with the reference supply voltage Vbase, in the state in which the load on the elastomer 1 (the translational external force in the direction of the central axis C with respect to the movable member 4) and the reference supply voltage Vbase are set at constant values.

As illustrated in FIG. 11, in the comparative example, it has been confirmed that, as the thickness of the elastomer 1 continues to decrease due to the creep phenomenon, the estimated value of the capacitance Cact continues to increase until the elastomer 1 finally breaks at a time tb.

Meanwhile, in the embodiment, it has been confirmed that the elastomer 1 remains unbroken for an extended period of time, and the estimated value of the capacitance Cact is maintained at a substantially constant value (the desired capacitance Ccmd).

Thus, the present embodiment enables effective prevention of the reduction in the thickness of the elastomer 1, which is attributable to the creep phenomenon, and hence enables effective prevention of the occurrence of the breakage of the elastomer 1.

Further, according to the embodiment described above, the capacitance Cact of the elastomer 1 can be properly estimated in sequence by the foregoing processing carried out by the capacitance estimating unit 22. This makes it possible to properly adjust the desired supply voltage Vcmd so as to suppress the reduction in the thickness of the elastomer 1 caused by the creep phenomenon.

The present invention is not limited to the embodiment described above. The following will describe some modifications.

In the foregoing embodiment, the structure of the variable stiffness mechanism 100 is not limited to the one illustrated in FIG. 1. A variable stiffness mechanism to which the present invention is applied may be a device having a different structure insofar as the stiffness between two members can be changed by adjusting the voltage applied to an elastomer interposed between the two members.

Further, the technique for estimating the capacitance Cact of the elastomer 1 may be different from the technique described in the foregoing embodiment. For example, a technique may be adopted whereby to sequentially detect the amount of charges of the elastomer 1 by integrating current detection values, and to divide the amount of charges by an observation value of the voltage applied to the elastomer 1 so as to estimate the capacitance of the elastomer 1.

The capacitance estimating unit 22 in the foregoing embodiment has carried out the processing for estimating the capacitance of the elastomer 1 for each period of each of the pulse widths Tw1 and Tw2 of the vibration component. Alternatively, however, it is possible, for example, to carry out the processing for estimating the capacitance of the elastomer 1 in the period of only one pulse width, i.e. either the pulse width Tw1 or Tw2. In this case, the other pulse width may be very small.

Further, in the foregoing embodiment, a square-wave signal has been used as the vibration component. Alternatively, however, the vibration component may be a voltage signal other than the square-wave signal insofar as the voltage signal is capable of triggering the transient response phenomenon, which causes the current to decrease on the basis of the capacitance of the elastomer 1. For example, a sawtooth-shaped voltage signal, a curved voltage signal or the like may be adopted as the vibration component.

DESCRIPTION OF REFERENCE NUMERALS

1 . . . Dielectric elastomer, 3 . . . Frame member (second member), 4 . . . Movable member (first member), 10 . . . DC power source (power source), 21 . . . Power source control unit, 22 . . . Capacitance estimating unit

What is claimed is:

1. A controller of a variable stiffness mechanism that includes a dielectric elastomer, the dielectric elastomer being interposed between a first member and a second member, which is relatively displaceable with respect to the first member, such that an elastic force is generated according to a relative displacement between the first member and the second member, and the dielectric elastomer also being configured such that a degree of stiffness thereof can be changed according to an applied voltage, the controller comprising:

a power source which outputs a voltage applied to the dielectric elastomer such that the voltage can be variably controlled;
a power source control unit which controls an output of the power source; and
a capacitance estimating unit which sequentially estimates a capacitance of the dielectric elastomer,
wherein the power source control unit is configured to carry out processing for setting a desired reference value of the applied voltage to meet a requirement related to the degree of stiffness of the dielectric elastomer in response to the requirement, processing for setting a desired value of the capacitance of the dielectric elastomer from the desired reference value and an observation value of an amount of the relative displacement between the first member and the second member based on a pre-established correlation among the voltage applied to the dielectric elastomer, the amount of relative displacement, and the capacitance of the dielectric elastomer, and processing for setting a desired value for control of an output voltage of the power source by correcting the desired reference value by a feedback manipulated variable determined based on a difference between the desired value of the capacitance and an estimated value of the capacitance obtained by the capacitance estimating unit such that the difference is approximated to zero, thereby controlling the output of the power source according to the desired value for control.

2. The controller of a variable stiffness mechanism according to claim 1,
wherein the power source control unit is configured to control the output of the power source such that the voltage output from the power source becomes a vibration component superimposed voltage obtained by superimposing a vibration component of a predetermined frequency over the desired value for control, and
the capacitance estimating unit is configured to sequentially carry out, at a predetermined estimation processing cycle synchronized with the vibration component, energizing current sampling for acquiring detection values of the energizing current at a plurality of sampling times in a current reduction period, in which the energizing current of the dielectric elastomer increases and then decreases according to a change of the voltage output from the power source in a case where the voltage changes due to the vibration component, and capacitance estimation processing for determining an estimated value of the capacitance of the dielectric elastomer from a model, which represents a correlation between a time-dependent change in the energizing current of the dielectric elastomer and the capacitance of the dielectric elastomer in the current reduction period, and from the detection values of the energizing current at the plurality of the sampling times.

3. The controller of a variable stiffness mechanism according to claim 2, wherein the vibration component is a square-wave signal.

4. The controller of a variable stiffness mechanism according to claim 2,
wherein the first member and the second member are provided such that an external force causing the relative displacement between the first member and the second member can be variably applied, and
the capacitance estimating unit is configured to further include a function for carrying out first processing for sequentially acquiring a first current detection value, which is a detection value of the energizing current immediately before a voltage value of the vibration component changes, in a state in which the voltage output from the power source is being controlled to the vibration component superimposed voltage, and second processing for predicting, based on a plurality of past values of the first current detection value acquired in the first processing, a time-dependent change pattern of the energizing current in the period of each estimation processing cycle, which is a time-dependent change pattern of the energizing current in a case where it is assumed that the voltage value of the vibration component in the period of the estimation processing cycle is continuously maintained at a voltage value immediately before a start of the period of the estimation processing cycle, before the period of the estimation processing cycle is started, and the capacitance estimating unit being configured also to correct, by the capacitance estimation processing at each estimation processing cycle, each of the detection values of the energizing current at the plurality of the sampling times during the current reduction period in the period of the estimation processing cycle, based on a current value at each sampling time specified by the time-dependent pattern predicted by the second processing for the estimation processing cycle, thereby to determine an estimated value of the capacitance of the dielectric elastomer based on a current value after the correction and the model.

5. The controller of a variable stiffness mechanism according to claim 1, wherein the dielectric elastomer is formed like a sheet and configured such that the applied voltage can be imparted in a direction of a thickness thereof, the dielectric elastomer has a middle portion thereof fixed to the first member and a peripheral part thereof fixed to the second member provided to be relatively movable in the direction of the thickness of the dielectric elastomer with respect to the first member, and the dielectric elastomer is provided in a tensioned state such that the dielectric elastomer is subjected to a tension between the first member and the second member in a state in which the applied voltage is not being imparted.

* * * * *